United States Patent
Seo et al.

(10) Patent No.: US 11,060,185 B2
(45) Date of Patent: Jul. 13, 2021

(54) GRAPHENE SYNTHESIS (71) Applicant: Commonwealth Scientific and Industrial Research Organisation, Campbell (AU)

(72) Inventors: Dong Han Seo, Campbell (AU); Shafique Pineda, Campbell (AU); Zhao Jun Han, Campbell (AU); Kostyantyn Ostrikov, Campbell (AU)

(73) Assignee: Commonwealth Scientific and Industrial Research Organisation, Campbell (AU)

( * ) Notice: Subject to any disclaimer, the term of this patent is extended or adjusted under 35 U.S.C. 154(b) by 0 days.

(21) Appl. No.: 15/752,387

(22) PCT Filed: Aug. 12, 2016

(86) PCT No.: PCT/AU2016/050738
§ 371 (c)(1),
(2) Date: Feb. 13, 2018

(87) PCT Pub. No.: WO2017/027908
PCT Pub. Date: Feb. 23, 2017

(65) Prior Publication Data
US 2019/0003042 A1  Jan. 3, 2019

(30) Foreign Application Priority Data
Aug. 14, 2015 (AU) ................. 2015903285

(51) Int. Cl.
*C23C 16/26* (2006.01)
*C23C 16/448* (2006.01)
*C23C 16/46* (2006.01)
*C01B 32/186* (2017.01)
(Continued)

(52) U.S. Cl.
CPC ............ *C23C 16/26* (2013.01); *C01B 32/186* (2017.08); *C23C 16/4485* (2013.01);
(Continued)

(58) Field of Classification Search
None
See application file for complete search history.

(56) References Cited

U.S. PATENT DOCUMENTS 4,168,998 A * 9/1979 Hasegawa ............... C30B 25/18
117/95
9,159,924 B2 10/2015 Lee et al.
(Continued)

FOREIGN PATENT DOCUMENTS

DE  102011000662 A1 * 8/2012 ............. B82Y 30/00
EP     2845919 A1 * 3/2015 .......... C23C 14/0605
(Continued)

OTHER PUBLICATIONS

Rahman, SFA et al. "Growhth of Graphene on Nickel Using a Natural Carbon Source by Thermal Chemical Vapor Depostion," Sains Malaysiana, 2014, vol. 43, Issue 8, pp. 1205-1211.*
(Continued)

*Primary Examiner* — David P Turocy
(74) *Attorney, Agent, or Firm* — Brinks Gilson & Lione (57) ABSTRACT

The invention relates to methods for the production of high quality graphene. In particular, the invention relates to single-step thermal methods which can be carried out in an ambient-air or vacuum environment using renewable biomass as a carbon source. Specifically, the invention comprises heating a metal substrate and carbon source in a sealed ambient environment to a temperature which produces carbon vapour from the carbon source such that the vapour comes into contact with the metal substrate, maintaining the temperature for a time sufficient to form a graphene lattice and then cooling the substrate at a controlled rate to form a deposited graphene.

22 Claims, 6 Drawing Sheets (51) Int. Cl.
 *G01N 27/30* (2006.01)
 *H01M 4/583* (2010.01)
(52) U.S. Cl.
 CPC ......... *C23C 16/463* (2013.01); *G01N 27/308* (2013.01); *H01M 4/583* (2013.01)

(56) References Cited

U.S. PATENT DOCUMENTS

| | | | | |
|---|---|---|---|---|
| 2009/0110627 | A1* | 4/2009 | Choi | B82Y 40/00 |
| | | | | 423/447.1 |
| 2012/0328906 | A1* | 12/2012 | Kwon | H01M 4/663 |
| | | | | 428/688 |
| 2014/0120030 | A1 | 5/2014 | Kim et al. | |
| 2014/0170317 | A1 | 6/2014 | Li et al. | |
| 2014/0234200 | A1* | 8/2014 | Tour | C01B 32/194 |
| | | | | 423/448 |
| 2015/0099214 | A1* | 4/2015 | Khe | H01B 1/04 |
| | | | | 429/523 |
| 2016/0230273 | A1* | 8/2016 | Russo | C23C 16/26 |

FOREIGN PATENT DOCUMENTS

| | | |
|---|---|---|
| EP | 2845919 A1 | 3/2015 |
| WO | 2014112953 A1 | 7/2014 |

OTHER PUBLICATIONS

Rahman, S.F.A. et al., "Growth of Uniform Carbon Thin Film Containing Nanocrystalline Graphene Clusters From Evaporated Palm Oil by Thermal Chemical Vapor Deposition," Japanese Journal of Applied Physics, Jun. 13, 2014, vol. 53, pp. 075101-1 through 075101-4 (4 pages).
Rahman, S.F.A. et al., "Growth of Graphene on Nickel Using a Natural Carbon Source by Thermal Chemical Vapor Deposition," Sains Malaysiana, 2014, vol. 43, Issue 8, pp. 1205 through 1211 (7 pages).
Wassei, J.K. et al., "Graphene, a Promising Transparent Conductor," Materials Today, Mar. 2010, vol. 13, Issue 3, pp. 52-59 (8 pages).
Australian Patent Office, Woden, ACT, Australia, International Search Report of International Application No. PCT/AU2016/050738, dated Sep. 6, 2016, 4 pages.
Ruan, Gedeng et al., "Growth of Graphene from Food, Insects, and Waste," Jul. 29, 2011, American Chemical Society, vol. 5, No. 9, pp. 7601-7607.
Li, Zhancheng et al., "Low-Temperature Growth of Graphene by Chemical Vapor Deposition Using Solid nd Liquid carbon Sources," Mar. 25, 2011, American Chemical Society, vol. 5, No. 4, pp. 3385-3390.

\* cited by examiner

GRAPHENE SYNTHESIS

CROSS-REFERENCE TO RELATED APPLICATIONS

This application is the National Stage of International Application Serial No. PCT/AU2016/050738 filed on Aug. 12, 2016 with the Australian Patent Office and published in English, which claims priority from Australian Provisional Patent Application No. 2015903285 filed Aug. 14, 2015, wherein the entire content of each of the aforementioned applications are hereby incorporated herein by reference.

FIELD OF THE INVENTION

The invention relates to methods for the production of high quality graphene. In particular, the invention relates to single-step thermal methods which can be carried out in an ambient-air or vacuum environment using renewable biomass as a carbon source.

BACKGROUND ART

Graphene exhibits unique electronic, optical, chemical and mechanical properties. Because of its extremely high electron mobility (electrons move through graphene about 100 times faster than silicon), very low absorption in the visible spectrum and relative flexibility and elasticity (compared to inorganics such as indium tin oxide), supported horizontal graphene as an active functional material has been revolutionising many fields. For instance, graphene is potentially useful for flexible, transparent, and wearable electronics, in energy storage devices (e.g., fuel cells, supercapacitors, photovoltaics, lithium-ion batteries, etc), in devices for diagnostics and therapeutics (e.g., biosensors, bioelectronics, drug delivery), in water purification (e.g., point-of-use filtration membranes) and in catalysis (e.g., to promote hydrogen evolution reactions). Control of defect content, microstructure, and surface chemical properties in the graphene will be critical to maximising the potential of graphene in these applications.

Graphene can be produced by a variety of methods. The mass production of graphene, which would be essential for widespread commercial use, has to date been targeted by a small number of general processes, most notably:

mechanical grinding of graphite and dispersion in solution followed by self assembly.
   thermal graphitisation of SiC.
   chemical vapour deposition (CVD) onto metal substrates.

Of these three methods, CVD onto metal substrates is the most promising, as it produces graphene films of sufficiently high quality to allow the potential of graphene to be more fully realised. CVD also allows roll-to-roll graphene synthesis.

The quality of the graphene produced is critical to its ability to function as a high performance material. High quality graphene possesses a minimal number of defects from the ideal perfectly regular $sp^2$ carbon film, and is also very thin, that is, the bulk material produced contains as few carbon atomic layers as possible.

The quality of graphene can be expressed quantitatively in terms of its electronic and optical performance. A low number of defects leads to a very low film resistance, which can typically be around 200 $\Omega$/sq. Defects in the graphene can diminish in-plane charge carrier transport which compromises the promising properties required for efficient field-emission, ultra-fast sensing and nano-electronics based devices.

Very thin films, for instance those having only one, two or three carbon atomic layers are highly transparent and have a transmittance of up to 97% which is useful for optical displays.

Thicker films and graphene in other forms (such as grains and coatings) can be useful in other circumstances, such as catalysis and filtration. An ability to control the thickness of graphene grown is highly desirable.

However, CVD onto metal substrates has some inherent limitations. The CVD apparatus itself is complex and expensive. CVD consumes very large amounts of power and like other thermal methods currently used, requires a low-pressure vacuum environment. This means that there are significant capital and ongoing operating costs associated with CVD. Also, the cost of vacuum equipment increases exponentially with the size of the vacuum chamber which limits the manufacturers' ability to scale up the process in a cost effective manner.

CVD also requires the use of highly purified feedstock gases, which are expensive. The use of gases such as hydrogen for substrate passivation and methane and ethylene as carbon source gases also means that additional hazard protection also needs to be put in place.

CVD also requires relatively long time frames, of the order of hours, for the growth, annealing and cooling steps to take place. This inherent requirement means that CVD is not readily amenable to the rapid mass production of affordable graphene.

The search for new methods of graphene is a very active area of endeavour and many researchers are investigating synthetic routes to high quality graphene that are safe, inexpensive and amenable to scale up.

For instance, U.S. Pat. No. 8,470,400 discloses graphene synthesis from chemical vapour deposition that take place in low pressure environments. However, like conventional methods, the methods disclosed in U.S. Pat. No. 8,470,400 require the use of purified gases, high temperatures and long processing times.

WO2013036272 discloses a crystalline graphene and a method for the preparation thereof. This method involves very high temperatures and long processing times. It uses multiple processing stages and requires harsh chemicals and processing environments.

U.S. 61/829,423 discloses the combustion synthesis of graphene and carbon nanomaterials. The method operates at very high temperatures and high pressures and requires long processing times. WO2013066269 discloses the synthesis of carbon nanostructures from liquid carbon precursors using chemical vapour deposition. However, the methods disclosed in WO2013066269 require the use of purified gases, multiple processing steps, and long processing times.

This snapshot of a handful of current cases illustrate the fact that "state-of-the-art" graphene syntheses require high temperatures, long processing times and in may cases expensive apparatus and consumables.

It is an object of the present invention to overcome or ameliorate at least one of the disadvantages of the prior art, or to provide a useful alternative.

Any discussion of the prior art throughout the specification should in no way be considered as an admission that such prior art is widely known or forms part of common general knowledge in the field.

SUMMARY

In a broad aspect, the invention provides a method of preparing a deposited graphene comprising the steps of heating a metal substrate and carbon source in a sealed ambient environment to a temperature which produces carbon vapour from the carbon source such that the vapour comes into contact with the metal substrate, maintaining the temperature for a time sufficient to form a graphene lattice and then cooling the substrate at a controlled rate to form a deposited graphene. The deposited graphene is for preference in the form of a film, most preferably a continuous film.

For instance, the invention provides a method of preparing a graphene film comprising the step of heating a metal substrate (e.g., nickel or copper) and carbon source in a sealed ambient environment to a temperature which produces carbon vapour from the carbon source and dissolves carbon into the metal substrate, maintaining the temperature for a time sufficient to form a graphene lattice and then cooling the substrate at a controlled rate to segregate the graphene lattice from the metal substrate to thereby form a film of graphene.

Unless the context clearly requires otherwise, throughout the description and the claims, the words "comprise", "comprising", and the like are to be construed in an inclusive sense as opposed to an exclusive or exhaustive sense; that is to say, in the sense of "including, but not limited to".

As used herein, the terms "segregate", "segregates", "segregation" and the like refer to the process whereby carbon atoms that were diffused inside the metal substrate lattice precipitate out onto the metal substrate surface.

The metal substrate may be a transition metal substrate, most advantageously nickel or copper. The Ni metal substrate is preferred at a purity of 99% and above.

If Nickel is used, it is preferably in polycrystalline form.

The metal substrate can be in any suitable form. Most usually it will be in the form of a film but it can also be in the form of grains, particles or even manufactured articles. When the metal substrate is in the form of particles, it is to be understood that the graphene exists discretely on the surface of the particles, for instance, a metal particle coated with one of more continuous layers of graphene.

The carbon source may be advantageously be biomass or derived from biomass or purified biomass. The biomass or purified biomass may be for example a long chain triglyceride (fatty acid), such as soybean oil, or it may be a cellulosic material. Renewable biomass may be used. The carbon source may be in any form, such as liquid or solid form with liquid usually advantageous.

The ratio of carbon source to metal substrate area is desirably in the range of 0.1 to 0.3 g of carbon source for each 10 $cm^2$ of substrate, that is, 0.01-0.03 mL/$cm^2$. For thin films, 0.01-0.025 ml/$cm^2$ is suitable, whereas for thicker films 0.025-0.03 ml/$cm^2$ or more can be used.

The metal substrate and carbon source are placed adjacent each other, so that the metal substrate and the carbon source are both located in the one heating zone. The substrate and source are placed such that vaporized precursor is able to contact the substrate.

The ambient environment may be air at atmospheric pressure or a vacuum.

In one embodiment, the ambient environment is air at atmospheric pressure. Although the present invention is described with reference to air, artificially prepared gases or combinations of gas that mimic the action of air could be used if desired. Such artificial combinations of gases could be used at pressures to mimic the effect achieved by air at ambient pressure.

In another embodiment, the ambient environment is a vacuum, preferably less than 1 mm Hg.

In particular embodiments, it is preferred that the metal substrate is nickel and the ambient environment is air at atmospheric pressure. Alternatively, it is preferred that the metal substrate is copper and the ambient environment is a vacuum.

Unlike most methods in the art, the methods of the present invention are free from the use of a compressed gas or gases. Feedstock gases are not required.

In one embodiment the sealed environment is contained in any inert container, for example a quartz or other dielectric heat resistant container such as a quartz, alumina or zirconia tube.

The temperature sufficient to form a graphene lattice is preferably in the range 650° C.-900° C. The temperature sufficient to form a graphene lattice is preferably maintained for 3 to 15 minutes depending on the purity of the metal foil. Maintaining the temperature at around 800° C., for a time period between 3-15 minutes result in upto about 19 layers of graphene. A shorter time frame can be used to making a single layer of graphene. An increased time period can be used to form graphen films of 1-3 layers in thickness. Increasing the time period for upto 15 minutes can be used to make graphene upto 19 layers in thickness.

If a thicker graphene film is required a higher growth temperature is preferred, for example, maintaining the temperature 875° C. or above, or even around 900° C. for a time period between 3-15 minutes result in greater than 20 layers of graphene. Maintaining the temperature for a shorter period of time at 900° C. is preferred for forming graphenes of 20-40 layers. Increasing the time period upto 15 minutes result in increased layers of graphene of 40 layers or more (>40 layers).

Once graphene reaches around about 40 layers or more, it may be regarded as a form of ultra-thin graphite. However, it will be understood that while the methods of the present invention refer to graphene, they also encompass any form of layered or multilayered continuous sp2 carbon sheets, such as ultrathin graphite, that can be prepared by the method of the present invention.

Preferably the substrate is cooled to ambient temperature at a controlled rate of 10-100° C./minute. Cooling the substrate at a controlled rate may be, for example, cooling the substrate back to ambient temperature at a rate of 50-100° C./minute, or alternatively, the substrate may be cooled at a rate of 25-50° C./minute, or 25-40° C./minute, or 15-25° C./minute or 5-15° C./minute or less than 5° C./minute. Examples include cooling the substrate at a rate of up to 18° C./minute or at a rate of up to 25° C./minute.

The method may also further comprise the step of decoupling graphene from the substrate.

As used herein, the term "decouple" "decouples", "decoupling" and the like refer to the removal or lifting of a formed graphene from the underlying substrate to isolate a graphene film.

The graphene may be decoupled by any conventional means. For instance, the graphene may be decoupled from the underlying metal substrate by dissolving the substrate in an acidic environment. In particular, a nickel substrate may advantageously be dissolved in $H_2SO_4$ or HCl or $FeCl_3$ or a copper substrate may be dissolved in any of the preceding or $HNO_3$.

The invention also relates to as-grown and free-standing graphene films prepared by the methods of the invention.

DESCRIPTION

Figure 1:
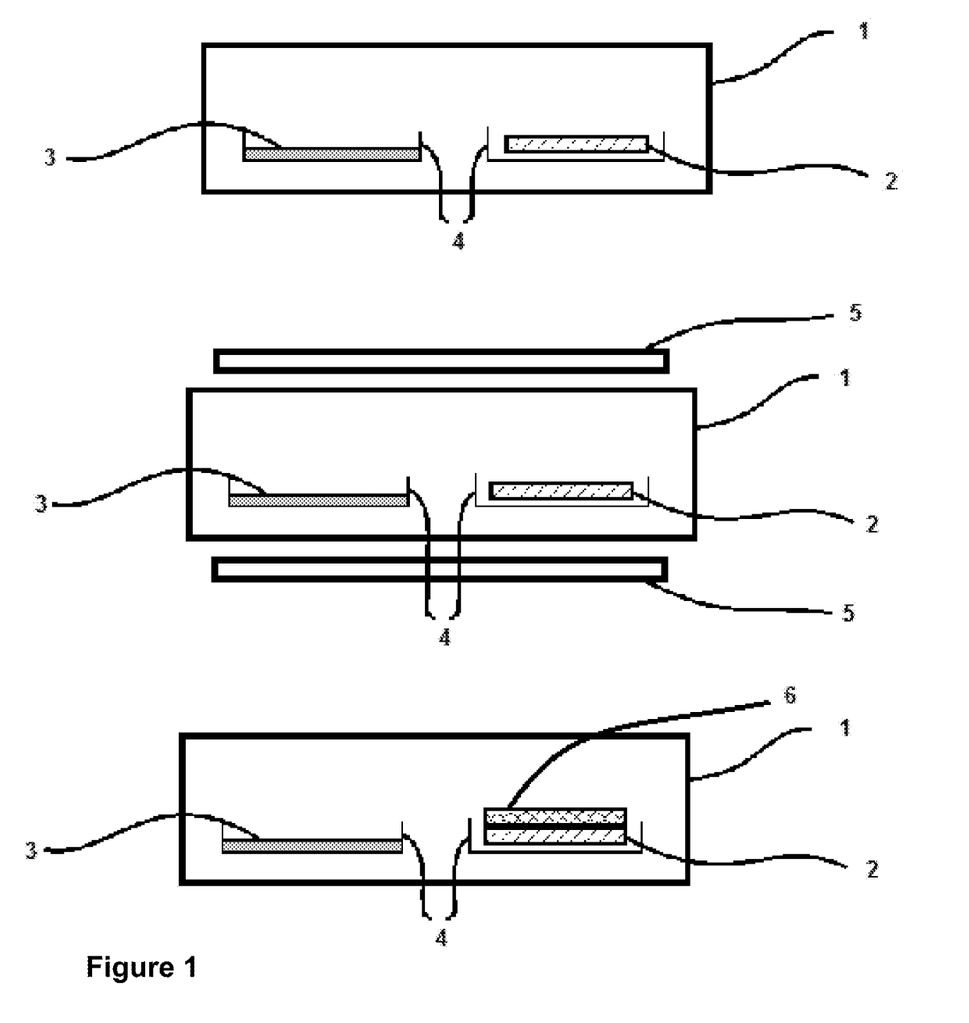
FIG. 1 shows a description of a preferred embodiment of the process of the present invention.

With reference to FIG. 1, the method of the present invention is carried out in a sealed container (1) in an oven.

Typically, the container (1) is an inert tube, for example a tube made from quartz, alumina, zirconia or similar. The size of the container is chosen so as to be relatively compatible with the substrate being coated, that is, it is desirable to minimize the amount of dead space in the container.

The oven can be any type of oven suitable for heating the container to temperatures of the order of 800° C. One type of suitable oven was found to be a thermal CVD furnace (OTF-1200X-UL, MTI Corp), which is adapted to heat tubular vessels. One example of a suitable tubular vessel is a quartz tube of 100 cm length and 5 cm diameter.

The method of the present invention involves placing a growth substrate (2) and carbon source (3) in relatively close proximity to one another in the container. They may be placed directly into the tube, or more usually, are placed in inert crucibles (4), such as alumina crucibles, prior to placement in the tube. The container is then sealed and placed in the oven, or alternatively placed in the oven and sealed. When the metal is Nickel, no gas evacuation or flushing is required and the atmosphere in the sealed container at the commencement of the process is air. An ordinary mechanical seal will suffice. There is no need for the container to be sealed to withstand significant pressure differences.

The metal substrate and carbon source are placed adjacent each other. The exact distance is not critical, as long as both the substrate and carbon source are within the heating zone. Due to the rapid thermal expansion of the vapours from the carbon source, the concentration of vapours will be fairly consistent across the heating zone. A degree of vacuum can be applied to aid in the flow of precursors within the heating zone if required.

Normally, as the distance between substrate and source increases, a larger amount of carbon source is required to cover a given area. The exact parameters can be readily determined experimentally for a given substrate size, carbon source and target graphene quality.

The positioning of the carbon source and substrate within the container should be such that when the container is in the oven, the carbon source and substrate are both simultaneously within the heating zone (5).

The substrate is a metal substrate, most desirably a transition metal substrate, for example a nickel substrate. It has been established by the inventors that there is little advantage to be gained from using nickel that is higher than 99.5% purity. 99.9% pure nickel or higher are suitable for use in the present invention, but they produce no discernible advantage over 99.5% or 99% pure nickel, which is available at a fraction of the cost of higher purity material.

The substrate (2) can be quite thin. One type of suitable substrate is polycrystalline Ni foil (25 μm, 99.5%) or also polycrystalline Ni foil (25 μm, 99%).

Without wishing to be bound by theory, it is believed that Ni acts as a catalyst for the breakdown of hydrocarbon species into smaller building units essential for the synthesis of graphene.

Other transition metals can be used with minor modification. For instance, while Nickel is a useful substrate under ambient atmospheric conditions, Copper can be used as a substrate for the growth of graphene by evacuating any ambient air within the tube at the start of the process. The remainder of the process is otherwise the same. However, regardless of the substrate, the methods of the present invention avoid the use of expensive compressed gases as required in prior art methods.

The carbon source can be any source of material that provides volatile carbon at temperatures between 200-650° C. at ambient pressures. For instance, animal or vegetable fat in unprocessed form have both been found to be useful.

One particularly useful source of carbon is raw soybean oil, which is a triglyceride of formula $C_{18}H_{36}O_6$. More abundant biomass and industrial by-products, for example, cellulosic materials, may be used. The present inventors have established that there is no need to use highly purified material as the carbon source. A minimal quantity is used, for example 0.1-0.25 mL of soybean oil provided sufficient carbon to coat an area of 10 $cm^2$ of metal substrate. If a thicker graphene film is required. 0.25-0.30 mL (or g) of carbon source per 10 $cm^2$ of metal substrate can be used.

If too much carbon source material is used, the graphene film will be thick, for instance, graphene films of about 5-10 layers are obtained. Similarly, if significantly lower amounts of carbon source than is optimal, then graphene formation will not occur and amorphous carbon obtained.

The furnace temperature is then raised to around 800° C. over a period of 20-30 minutes. A typical ramping rate is from 25-35° C./min). During the ramping stage (~300° C.-350° C.) the precursor is vaporized and the long carbon chains in the soybean oil begin to be broken down into gaseous carbon building units via thermal dissociation. Those skilled in the art will appreciate that the precise dissociation temperature will differ based upon the chemical and physical properties of carbon source precursor material. Simultaneously, gaseous carbon building units diffuse throughout the tube and towards the Ni foil growth substrate. As the temperature in the furnace gradually increases to 800° C., the carbon precursor is further broken down into simpler carbon units for graphene generation on the surface of metal substrate. In addition, as the temperature rises the carbon solubility in Ni increases and the carbon building units begin to dissolve into the Ni bulk. From 500° C. a graphitization process takes place where carbon atoms are starting to arrange themselves in sp2 configuration. From 500° C. to 800° C. graphene lattice is shaped.

Graphene formation is observed to take place from 650° C., although the best quality graphene (in terms of low defects) is obtained from about 800° C.

Graphene also grows at higher temperatures Whilst it is advantageous to carry out the growth at the lowest possible temperatures, it has been found that conducting the growth process at 900° C., rather than 800° C. results in a thicker graphene layer which is less hydrophobic in character. The contact angle at 900° C. is 140.2° compared to 96.1° for graphene films grown at 800° C., so by varying the growth parameters the contact angle can be varied significantly by an amount up to at least 40° to 45°.

Without wishing to be bound by theory, it is possible that temperature could be dependent on the chemical makeup of the carbon precursor chemistry, for instance a simpler carbon chain could enable graphene production at a lower temperature.

Once the desired temperature is reached, the furnace is held at that temperature, for example, 800° C. (for 10-15 min for 99.5% purity Ni foil) to enable growth. Graphene grains enlarge during the annealing process. The annealing time can be reduced by using lower purity films. For instance, the annealing time can be reduced to around 3 minutes if 99% purity Ni foil is used.

Following the completion of the growth period, the tube is immediately removed from the heating zone to enable the controlled cooling to take place.

Control of the cooling rate is a key step in the process of the present invention. During the cooling stage, carbon segregates from the metal bulk, resulting in the formation of graphene on the metal surface. If cooling is controlled to be too slow, graphite-like thick graphene films (>10 graphene layers) are obtained. The presence of ambient air during the cooling process is also thought to etch the graphene film and helps the formation of high quality graphene film of typically 1-3 layers.

The use of a Nickel substrate does not appear to be adversely affected by the presence of air, however, Copper substrates provide more growth of graphene domains in the absence of any gas, i.e. under vacuum. Substrates that are more susceptible to competing oxidation reactions would advantageously be reacted under conditions requiring the additional evacuation step.

Both the amount of precursor and the cooling rate independently affect the resultant film. If good quality films of greater thickness than 2-3 atomic layers, for instance, 10 or more, 40 or more, or even 100 or more layers are required, it is advantageous to increase the amount of precursor whist at the same time dropping the cooling rate.

The thickness of the films is measured by the optical transmission, whereas quality is determined by $I_D/I_G$ and $I_{2D}/I_G$ ratios which are well established Raman spectroscopic parameters for determining graphene quality At a fast cooling rate, typically 25° C./min and optimal precursor amount (typically ~0.15 mL per 10 cm$^2$ of substrate), thin films with 2-3 layers of graphene with good quality ($I_D/I_G$ up to 0.4 and $I_{2D}/I_G$ up to 2.5) are observed. Reducing the cooling rate to 18 C/min and increasing the precursor amount (typically ~0.2 mL per 10 cm$^2$ of substrate), thicker films with around 20 layers of graphene of good quality ($I_D/I_G$ up to 0.4 and $I_{2D}/I_G$ up to 1.8) are observed. Reducing the cooling rate even further, to around 10 C/min and significantly increasing the precursor amount (typically ~0.25 mL per 10 cm$^2$ of substrate), gives thick films of graphene with around 40 layers with a very high quality ($I_D/I_G$ up to 0.4 and $I_{2D}/I_G$ to 0.4)

Figure 2:
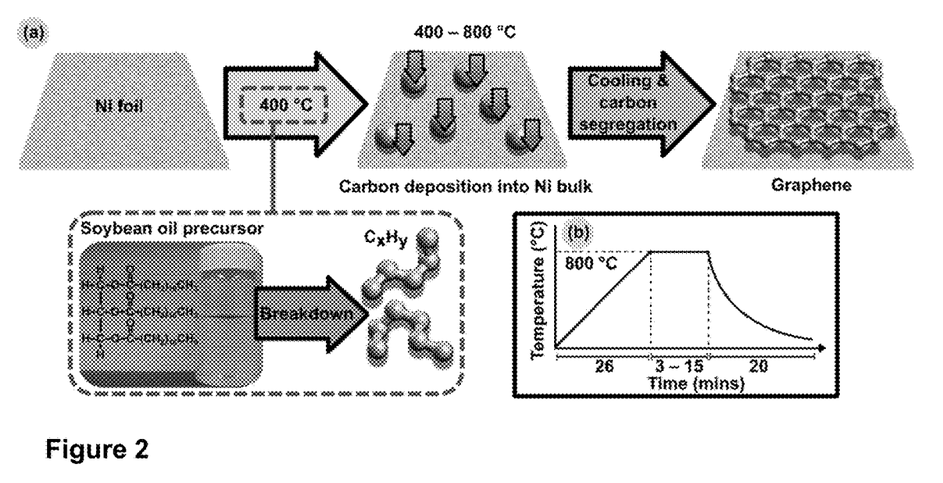
FIG. 2 shows (a) the proposed mechanism for graphene growth, and (b) the temperature profile of the growth technique of the present invention.

FIG. 2 shows the proposed mechanism for graphene growth, as well as the temperature profile of a preferred embodiment of the process.

It was observed that the carbon precursor content and sample cooling rate significantly influenced the quality of the subsequently produced graphene films. In an ambient-air environment, an insufficient amount of precursor material leads to the presence of O and N species in the subsequent graphene, in the form of C—O or C—N amorphous carbons. This may suggest the critical role of the thermally dissociated precursor (soybean oil in the invention as exemplified) in consuming the O and N species present in the ambient-air environment.

It is thought that an excessive amount of precursor material may lead to an oversaturation of deposited carbon in the metal substrate, which can lead to crystallization of carbon on the metal surface before the cooling process. This may explain the resulting formation of undesirably thick graphene sheets observed when excessive carbon source precursor is used.

A slow sample cooling rate may, on the other hand, promote excessive carbon segregation from the metal bulk during the cooling process, and may account the observed formation of graphite.

A number of substrates were tested under the same experimental conditions used for the nickel substrate. Even when these substrates did not exhibit graphene formation, they did show that a graphitization process (sp$^3$ to sp$^2$ transition of the carbon) had occurred. The graphitization process precedes the possible arrangement of carbon atoms into graphene.

This observation may suggest the key role of the properties of the substrate (such as carbon solubility and catalytic effect) in graphene formation.

The process for ambient-air growth of graphene of the present invention has been successfully applied using other types of carbon-containing precursors, including triglycerides such as butter, which produced high quality single-tri layer graphene films. It is believed that the method of the present invention is versatile and may be tailored to transform other renewable and redundant biomasses into graphene films.

It is important to note that throughout the process, the pressure in the container is maintained at atmospheric pressure for the Nickel substrate. Throughout the entire growth process, no additional gases were introduced into the quartz tube.

After cooling, the substrate (2) was removed and the graphene (6) grown thereon was analysed.

The following table shows a comparison between the methods of the present invention and the leading articles relating to graphene synthesis.

TABLE 1

Comparison of Synthesis Methods.

| Metric | Ruoff et al.[1] | Kim et al.[2] | Tour et al.[3] | Bae et al.[4] | Present method |
|---|---|---|---|---|---|
| Metal growth substrate | Copper | Nickel | Copper | Copper | Nickel |
| Carbon precursor | Methane | Methane | Carbon containing biomasses | Methane | Renewable soybean oil biomass |
| Feedstock gases | Hydrogen | Hydrogen & Argon | Hydrogen & Argon | Hydrogen | None |
| Pressure (Torr) | Vacuum | Vacuum | Vacuum | Vacuum | Atmospheric |
| Synthesis environment | Purified gases | Purified gases | Purified gases | Purified gases | Ambient environment (Air at atmospheric pressure or vacuum) |
| Processing time (min) | 150 | 140 | 150 | 160 | 30 |
| Temperature (° C.) | 1000 | 1000 | 1050 | 1000 | 800 |
| Estimated cost ($) per cm$^2$ of graphene film |  | 2.6-2.9 |  |  | 0.4 |

[1] X. Li, W. Cai, J. An, S. Kim, J. Nah, D. Yang, R. Piner, A. Velamakanni, I. Jung, E. Tutuc, S. K. Banerjee, L. Colombo and R. S. Ruoff, Science; 2009, 324, 1312-1314.
[2] K. S. Kim, Y. Zhao, H. Jang, S. Y. Lee, J. M. Kim, K. S. Kim, J.-H. Ahn, P. Kim, J.-Y. Choi and B. H. Hong, Nature, 2009, 457, 706-710.
[3] G. Ruan; Z. Sun, Z. Peng and J. M. Tour, ACS Nano, 2011, 5, 7601-7607.
[4] S. Bae, H. Kim, Y. Lee, X. Xu, J.-S. Park, Y. Zheng, J. Balakrishnan, T. Lei, H. Ri Kim, Y. I. Song, Y.-J. Kim, K. S. Kim, B. Ozyilmaz, J.-H. Ahn, B. H. Hong and S. Iijima, Nat Nano, 2010, 5, 574-578.

The present method thus provides many advantages over other methods, including the ability to use a renewable low quality biomass, air at atmospheric pressure and lower temperatures.

The use of lower temperatures and shorter processing times is also energetically favourable. As a result, the present invention can produce graphene for around 14% of the cost of conventional methods.

The quality of the graphene produced by the methods of the present invention was compared to graphene available from commercial manufacturers. The results are presented in table 2 below. The details were sourced from the Graphene Market Report 2015, FutureMarketsInc, and websites of the respective companies. All the commercial graphene films described in table 2 were prepared using conventional technology under purified gas atmospheres.

TABLE 2

Comparison of Graphene Properties.

| Company | Transmittance (%) | Film Resistance (Ω/sq) |
|---|---|---|
| Present invention | 94.3 | 330 |
| 2D Carbon Tech | 85 | 200-400 |
| BGT Materials | 95 | 800 |
| Graphenea | 97 | 450 |
| Graphene Square | 97 | 250-400 |
| Wuxi Graphene Film | 97 | 600 |

It can be seen that the present invention produces graphene with a very high transmittance, making it very suitable for optical uses. In addition, the resistance of the graphene produced by the present methods is very low, meaning the graphene is relatively defect-free and highly suitable for electronic uses.

The present invention allows for the synthesis of high quality graphene films to take place in an ambient-air environment via thermal chemical vapour deposition. The absence of a vacuum chamber means that the present process can be highly scalable. Ambient-air synthesis according to the present invention facilitates a streamlined integration into the large-scale graphene production infrastructure such as roll-to-roll or batch processing required for industrial production.

The present invention allows for thermal-based synthesis in the absence of any purified compressed feedstock gases (e.g., methane, hydrogen, argon, nitrogen, etc.), which are costly and/or highly explosive. The synthesis technique of the present invention does not require any purified feedstock gases, and instead, can utilize far cheaper carbon source material such as a renewable biomass as the precursor for the synthesis of graphene films. Notably, this enables the process of the present invention to be technologically sustainable, and also significantly cheaper and safer than presently available methods.

The methods of the present invention significantly reduce the processing times compared to techniques presently described in the literature and those adopted by industry. The present process involves only a single step, and requires significantly less processing time. This is unlike existing methods for the synthesis of graphene films, which involve sample pre-treatments in purified gas environments at high temperatures and much longer processing time.

The present methods are thus safe, environmentally-friendly, and resource-efficient technique for graphene synthesis.

EXAMPLES

Example 1. Optically Transparent Conductive Film

In one embodiment, the controlled growth conditions of the present invention could be used to produce a thin (optically transparent) graphene film useful in a sensing device. Films of materials which are optically transparent in a practical sense are those which exhibit optical transmissions of 80-100% in the visible wavelength range, similar to the transparencies achieved by indium tin oxide (ITO) films Growth of Graphene The growth of graphene was carried out in a thermal CVD furnace (OTF-1200X-UL, MTI Corp). A quartz tube was used. Polycrystalline Ni foils (25 µm, 99.5% or 99%, Alfa Aesar) were used as the growth substrate.

Two alumina crucibles were loaded into a quartz tube. One crucible contained the carbon source, which was 0.1-0.25 mL of soybean oil. The other crucible held a square (10 cm²) of the Ni foil growth substrate. These two crucibles were placed close proximity within the quartz tube. The tube was positioned so that both crucibles were within the heating zone of the furnace. The open ends of the quartz tube were then sealed.

The furnace temperature was raised to 800° C. (30° C./min) followed by maintaining the temperature for 15 mins for 99.5% purity Ni foil and 3 mins for 99% purity Ni foil at 800° C. to form a graphene lattice. Following lattice formation, the growth substrate was immediately removed from the heating zone to enable cooling at a controlled rate (50-100° C./min) to allow segregation of the graphene lattice from the metal substrate to form a deposited graphene.

The pressure in the tube was maintained at ambient pressure. Throughout the entire growth process, no additional gases were introduced into the quartz tube.

Once cooled to ambient temperature, the substrate was removed from the tube and the as-grown graphene film was analysed using conventional techniques, as described below. The film resistance was very low, 330 Ω ohms/sq using four probe sheet resistance measurements and the visible spectrum transmittance was 94.3%. Also Raman spectra indicate that graphene is formed with a relatively low proportion of defects and being very thin (three or less films). These characterisation suggest that this graphene obtain from this process is high quality.

The functional properties of the graphene of the present invention are also very advantageous, as shown by its ability to act as a genosensor, which is detailed below.

Transfer of Graphene

A poly (methyl methacrylate) (PMMA)-assisted transfer of graphene was used. 46 mg/mL of PMMA ($M_w$ 996,000) was spin-coated on the as-grown graphene on Ni foil (3000 rpm for 1 min). The sample was then dried in open air for 12 hours. Subsequently, the underlying Ni foil was dissolved in 1 M $FeCl_3$ in 30 minutes. The PMMA/graphene film then floated to the surface. This was washed several times with deionised water. Next, the PMMA/graphene was lifted off from the deionised water bath and transferred onto a glass substrate. The PMMA was then dissolved with acetone, and the sample was repeatedly washed with deionised water. The graphene isolated on glass was then used for subsequent microscopy and electrical characterizations.

Microscopy and Microanalysis

Field-emission scanning electron microscopic (FE-SEM) images were obtained by Zeiss Auriga microscope operated at 5 keV electron beam energy with an InLens secondary electron detector. Raman spectroscopy was performed using a Renishaw inVia spectrometer with a laser excitation at 514 nm (Ar laser) and a probing spot size of ~1 µm². X-ray photoelectron spectroscopy (XPS) spectra were recorded by Specs SAGE 150 spectroscope with the Mg Kα excitation at 1253.6 eV. Both survey and narrow scans of C 1s and O 1s were conducted. Transmission electron microscopic (TEM) images were obtained by the JEOL 2200FS TEM microscope operated at 200 kV.

Optical Characterizations

Optical images were obtained by an Olympus BX51 optical microscope. Transmittance measurements were obtained by a Varian Cary 5000 UV-Vis spectrophotometer. A graphene area of 4 cm² was used, and optical spectra were recorded in the wavelengths of 300-800 nm.

Electrical Four-Probe Measurements

Silver paint was applied to the graphene transferred onto glass. A graphene area of 1 cm² was used. Four-point probe measurements were conducted at room temperature.

Figure 3:
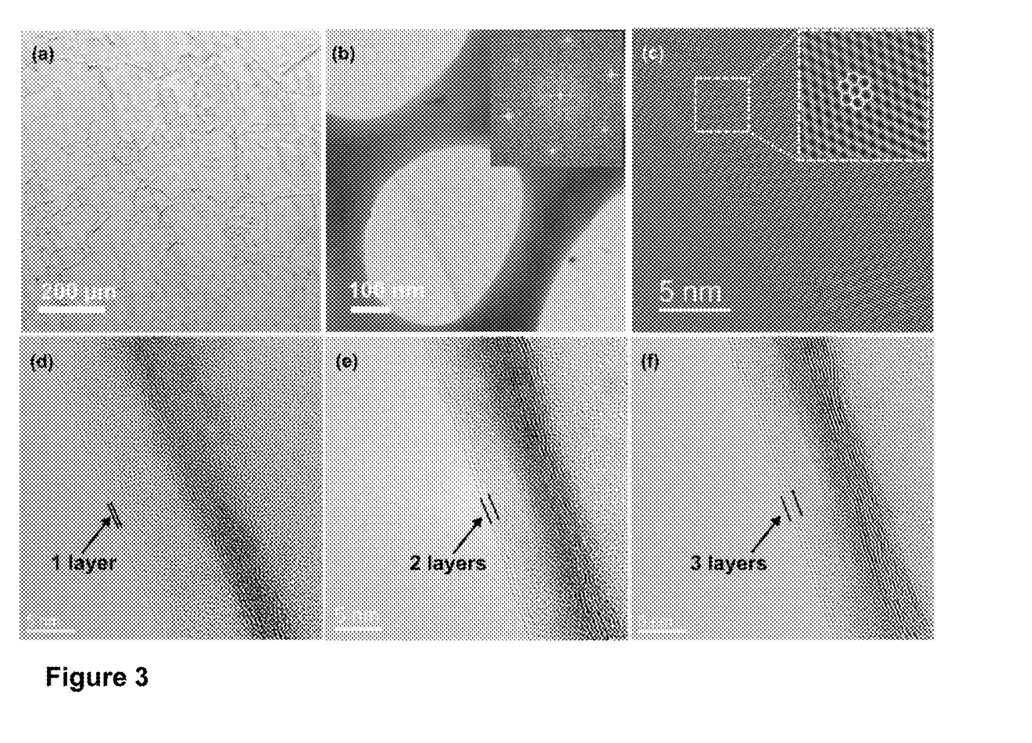
FIG. 3 shows structural characterizations of graphene of the present invention including, (a) optical micrograph, (b) low-resolution TEM with electron diffraction pattern (inset), (c) FFT of graphene, (d)-(e) HRTEM showing 1-3 graphene layers, respectively.

The topographic characterizations in FIG. 3 demonstrate the uniformity and coverage of the as-grown graphene. A continuous, smooth, and large-area graphene film with good homogeneity was observed to cover the entire surface of the Ni foil. The optical micrograph in FIG. 3(a) indicates an average graphene grain size of 30-200 µm. The large-area of transparent graphene film is evidenced by the low-magnification TEM image (FIG. 3(b)) and the respective electron diffraction pattern (inset). Correspondingly, a Fast Fourier Transform (FFT) spectra in FIG. 3(c) further supports the presence of graphene lattices, and TEM characterizations in FIG. 3(e)-(g) indicate the presence of 1-3 graphene layers in the graphene film. Furthermore, the graphene films are observed to be continuous across the Ni grain boundaries, as evidenced by close-up SEM images which show the wrinkled surface of the graphene films. Such morphological features stem from the difference in coefficient of thermal expansion between graphene and Ni, and indicate continuity of the graphene film as these wrinkles span the grain boundary.

Figure 4:
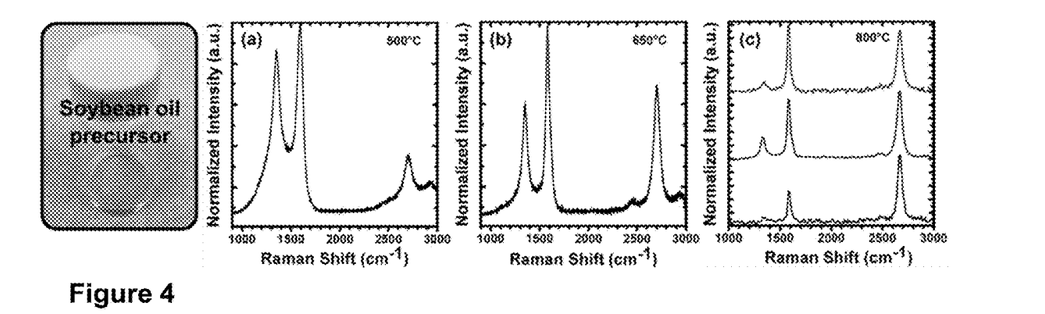
FIG. 4 shows Raman spectroscopic characterisations s for the transformation of soybean oil precursor with increasing annealing temperatures at (a) 500° C., (b) 650° C., and (c) 800° C.

The surface of the as-grown graphene was characterized by Raman and X-ray photoelectron spectroscopy (XPS). The Raman spectra in FIG. 4 illustrate the transformation of the precursor at different stages of annealing temperatures. In the Raman spectra, three distinct peaks are present, namely, the characteristic disorder peak (D-band) at 1350 $cm^{-1}$, the graphitic peak (G-band) at 1580 $cm^{-1}$, and the second-order 2D-band at 2670 $cm^{-1}$. The G-band arises from the in-plane vibrational $E_{2g}$ mode of the $sp^2$-hybridized carbon, the D-band is attributed to the finite crystallite size effect and various defects induced in the $sp^2$ carbon materials, and the 2D-band is a second-order Raman spectral feature due to the three-dimensional inter-planar stacking of hexagonal carbon networks. At low temperatures of 500° C., there is insufficient energy provided to breakdown the soybean oil precursor into smaller hydrocarbon building units for graphene (FIG. 4(a)). The transition of graphene quality with increasing temperatures is evident (FIG. 4(b)), and large area low-defect graphene sheets are produced as shown with an annealing temperature of 800° C. (FIG. 4(c)). At 800° C., the ratios of Raman $I_{2D}/I_G$~(0.9-2.2) and $I_D/I_G$~(0.1-0.25) indicate the presence of 1-3 graphene layers with low defects and a dominant $sp^2$ graphitic structure. These results show that temperature is a key parameter which controls the nucleation and growth of graphene from the carbon source precursor.

Figure 5:
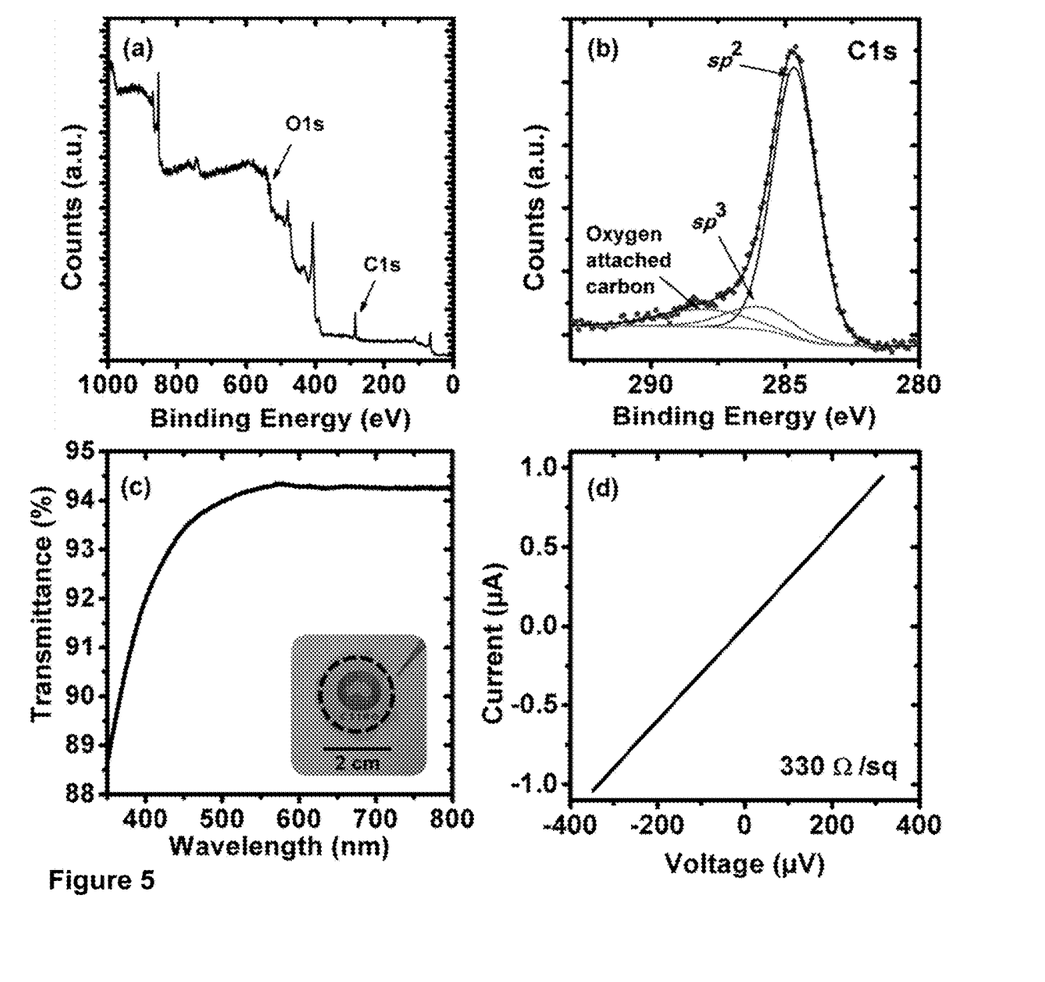
FIG. 5 shows miscellaneous properties of the graphene of the present invention, including (a) XPS survey scan, (b) C is scan, (c) transmittance spectra and (d) conductivity measurements.

The XPS characterizations in FIGS. 5(a)-(b) show a single and narrow C 1s peak at the binding energy (BE) of 284.5 eV, which indicates the nanostructure is made of mostly carbon atoms. The survey scan of FIG. 5(a) shows a small peak intensity of the C 1s in relation to the Ni LMM, and suggests the presence of an atomically thin graphene film such that the electron beam may penetrate through to the underlying Ni foil growth substrate. The corresponding C is narrow scan in FIG. 5(b) may be fitted by three peaks corresponding to the carbon $sp^2$ (BE~284.5 eV), $sp^3$ (BE~285.4 eV), and the oxygen-attached carbons (BE~286 eV). The graphene of the present invention demonstrates high ratios of $sp^2/sp^3$ carbons and C/O. This indicates the graphene lattice is of high structural quality, and its growth was not affected by the N and O species present in the ambient-air environment. The optical transmittance of the transferred graphene film is shown in FIG. 5(c). A peak transmittance of 94.3% at 550 nm is observed, and suggests a film thickness averaging 2 graphene layers. FIG. 5(d) illustrates the conductivity measurements of our graphene, where a sheet resistance 330 Ohm/sq is reported. These results suggest that the graphene of the present invention possesses a low level of defects and a highly crystalline lattice, leading to its excellent optoelectrical properties which are comparable to if not better than those obtained by conventional CVD methods. Thus, our as-grown graphene films are highly promising nanomaterials for integration in a host of electronic devices.

The method of the present invention can be quite readily scaled to larger area sample by simple control of precursor flow to enable high quality graphene films of different dimensions to be produced. In the case of the present invention, the process for preparing a 4 cm×2.5 cm strip was readily scaled to a 10 cm×2.5 cm strip with no complications or drop in quality of the graphene film.

Biosensor Device

The present invention provides access to large-area, uniform, and continuous graphene films. One such potential application for this material is in the area of high-throughput electrochemical biosensing devices. Electrochemical sensing methods for minute amounts of nucleic acid samples offer attractive opportunities for decentralized genetic testing and a plethora of other preventative health technologies, which require portable, cost-effective, and low-power readout devices.

Neurodegenerative diseases such as Alzheimer's disease are candidates for such testing. These diseases are becoming more prevalent with the ageing population. At present, over 40 million individuals worldwide are affected by Alzheimer's disease and this may treble by 2050. Importantly, Alzheimer's disease may be best managed with early intervention therapies provided it is diagnosed as early as possible. Recently, post-transcriptional epigenetic regulations of gene expressions have been found to provide highly-valuable serum-based nucleic acid biomarkers which may be utilized to enable early diagnostic strategies for the disease. Graphene, particularly high quality graphene in large sheets as produced by the present invention, can be used as biosensing electrode to detect and provide early diagnosis for Alzheimer's disease.

The graphene produced by the method of the present invention was used to prepare an electrochemical genosensor for Alzheimer's disease to demonstrate the excellent functionality of the graphene films of the present invention. The general configuration of the biosensor is set out in FIG. 6.

Biosensor Device Assembly

The as-grown graphene on Ni foil was treated with a low-temperature $O_2$ plasma (100 W, 7 seconds) to introduce carboxyl functional groups on its surface. The sample was placed flat and 2 cm below the plasma generation zone. The size of each sensing substrate was 2 cm×1 cm. Subsequently, the plasma-activated graphene was treated with 0.5 M N-(3-Dimethylaminopropyl)-N'-ethylcarbodiimide hydrochloride (EDC) and 0.03 M N-hydroxysulfosuccinimide (NHS) in phosphate buffered saline (PBS, pH=7) for 15 mins. This enabled the formation of active ester intermediates via carbodiimide chemistry. Next, the surface of graphene was washed several times with phosphate buffered saline (PBS, pH 7, Sigma Aldrich) and DI water to remove excess EDC/NHS.

Next, $NH_2$-conjugated miRNAs (probe sequence: 5'-$NH_2$—HGGTGGAGGGGACGTTTGCAGGT-3') were diluted in PBS to 0.2 μM, and 50 μL was pipetted onto the EDC/NHS-treated surface. This was left to incubate overnight in a wet environment and at room temperature. Next, the sensing surface was washed with 0.05% sodium dodecyl sulfonate (SDS) in 0.04 M hydroxylamine solution to deactivate the remaining carboxyl functional groups and to remove non-specifically bound probe miRNAs. Then, 0.01 M Polyethylene glycol (PEG) was loaded on the sensing surface to block the exposed areas of graphene to reduce further non-specific binding. Next, the (biomarker) miRNA sequence (target sequence: 5'-CCACCUCCCCUGCAAAC-GUCCA-3) was dissolved in human serum (Human Plasma AB) to obtain dynamic concentrations of 1 nM-0.1 pM, that were pipetted onto the sensing surface. This was left to incubate at 45° C. for 20 mins to induce hybridization between the complementary probe and target sequences.

Finally, a washing step with PBS/DI water was employed to remove remaining non-specifically bounded target miRNAs. To demonstrate sensing specificity, a similar protocol was adopted by replacing the target sequence with a single-base mismatched miRNA sequence (non-complementary sequence: 5'-CCGCCUCCCCUGCAAACGUCCA-3). This fully assembled device was then utilized in a three-electrode electrochemical cell for biosensing measurements.

Biosensing Measurements

The electrochemical measurements were conducted in 10 mM $FeCN_8$ in 0.1 M $Na_2SO_4$ at room temperature. A three-electrode cell configuration was employed. The three electrode cell used the as-grown graphene on Ni as the working electrode, a Pt wire as the counter electrode, and an Ag/AgCl reference electrode (MetroOhm). The EIS measurements were conducted in the frequency range from 500 kHz-1 kHz, using a BioLogic VSP 300 potentiostat/galvanostat instrument. The charge-transfer resistance $R_{ct}$ of the sensor following incubation with the target miRNA was expressed as a percentage of $R_{ct}$ in the reference (blank) case, which was incubated in the human serum medium in the absence of target miRNAs.

Figure 6:
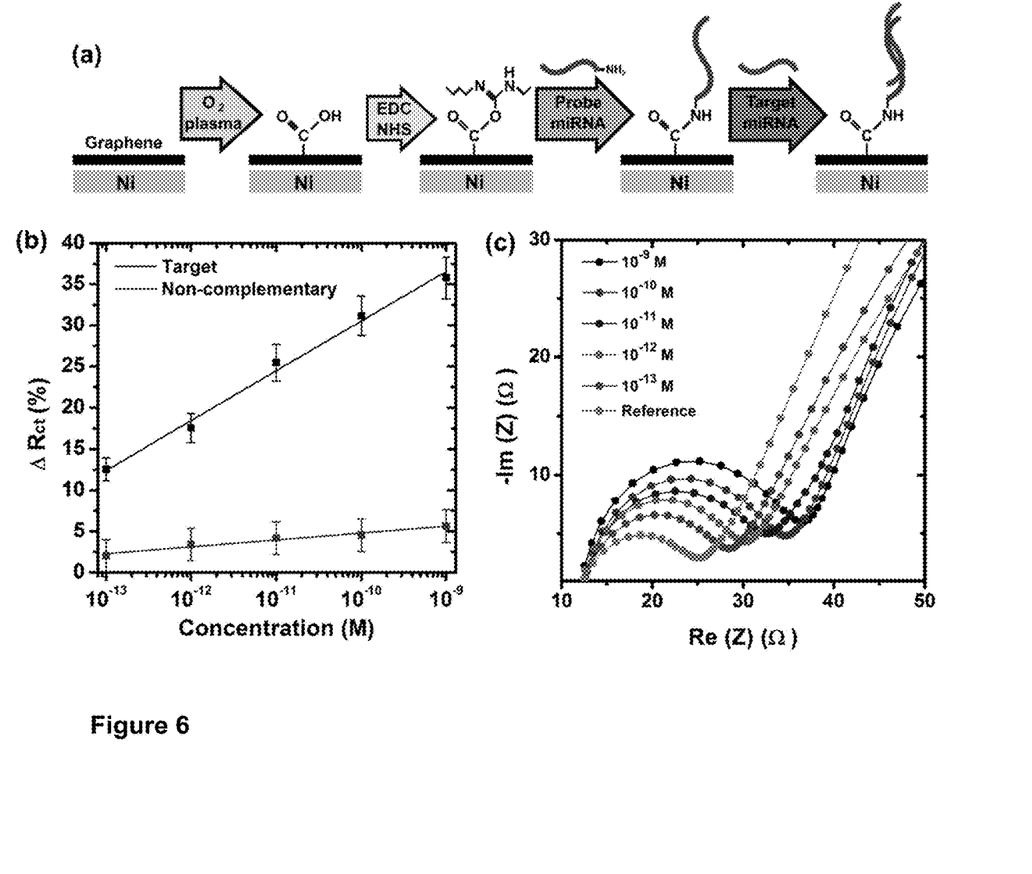
FIG. 6 shows (a) the use of graphene of the present invention in a biosensor assembly and (b)-(c) respective biosensing results.

The impedance spectra in FIGS. 6(b)-(c) demonstrate the change in electrode-electrolyte resistance ($R_{ct}$) at the biosensing electrode interface due to selective immobilization of target analyte. Notably, the device of the present invention exhibits a bio-detection sensitivity of 0.1 μM, with device selectivity down to single-base mismatched sequences, and a large dynamic sensing range (1 nm-0.1 μM). We define $\Delta R_{ct}$ by $(R_{ct}-R_0)/R_0$, where $R_0$ is the charge-transfer resistance of the reference sample. This increase in $\Delta R_{ct}$ may be attributed to a retarded charge transport towards the graphene surface, either through spatial blocking or electrical repulsion. In particular, the hybridization between complementary genomic sequences induces a build-up of negative surface charge, and the repulsion of negatively charged ferricyanide ions, which leads to a rise in $R_{ct}$. In addition, the device shows negligible response to the non-complementary miRNA. This performance is comparable to commercial ELISAs, and other graphene-based genosensors reported in the recent literature.

Importantly, the integration of the graphene of the present invention as a biosensing platform enables a highly specific detection of miRNA biomarkers at physiologically-relevant concentrations. Thus, this may enable an early diagnosis of Alzheimer's disease, which requires the quantification of multiple miRNA biomarkers in complex biological environments. Electrochemical graphene-based biosensors are advantageous over ELISAs and other biosensing techniques, as these either require resource-consuming (energy, time) fabrication for bio-detection (e.g., fluorescent tags, lithography, electrode patterning, etc.), large sample amounts (of miRNA, i.e. extracted blood from patient), or multi-staged amplification bioassays to quantify the concentration of target analyte. Currently, the one of the main drawbacks with integrating graphene for medical sensing is its cost for production functional graphene. However, the method of the present invention demonstrate that high-quality functional graphene films can be grown using a simple, cheap and industrially viable technique, and that the graphene can be successfully integrated as a genosensor for Alzheimer's disease. The high-throughput electrochemical performance of our graphene genosensor provides a practical demonstration of the high quality of graphene produced by the present invention.

Electrochemical graphene-based genosensors may be tailored to different types of other diseases, epidemics, including also point-of-care diagnostics for infectious diseases.

Example 2. Controlled Thickness Graphenes

The growth of graphene was carried out as described for example 1, with modification to the amount of graphene and the cooling rate. A quartz tube was used. Polycrystalline Ni foils (25 µm, 99.5% or 99%) were used as the growth substrate.

Two alumina crucibles were loaded into a quartz tube. One crucible contained the carbon source, the other crucible held the Ni foil growth substrate. These two crucibles were placed in close proximity inside the quartz tube. The tube was positioned so that both crucibles were within the heating zone of the furnace. The open ends of the quartz tube were then sealed.

The furnace temperature was raised to 800° C. (30° C./min) followed by maintaining the temperature for 15 mins to allow graphene lattice formation on 99.5% purity Ni foil and 3 mins for 99% purity Ni foil at 800° C.

After the growth step, the growth substrate was immediately removed from the heating zone and cooled at the controlled rate.

The pressure in the tube was maintained at ambient pressure. Throughout the entire growth process, no additional gases were introduced into the quartz tube. Once cooled to ambient temperature, the substrate was removed from the tube and analysed.

| Cooling rate | Precursor amount | Resultant film |
|---|---|---|
| 25° C./min | 0.15 mL per 10 cm² of substrate | Approximately 2-3 layers |
| 18° C./min | 0.2 mL per 10 cm² of substrate | Approximately 20 layers |
| 10° C./min | 0.25 mL per 10 cm² of substrate | Approximately 40 layers |

With increased amount of precursor material and decreased cooling rate of sample, graphene samples are observed to increase in thickness and reduce in defect content. This transition is illustrated in FIG. 7.

Figure 7:
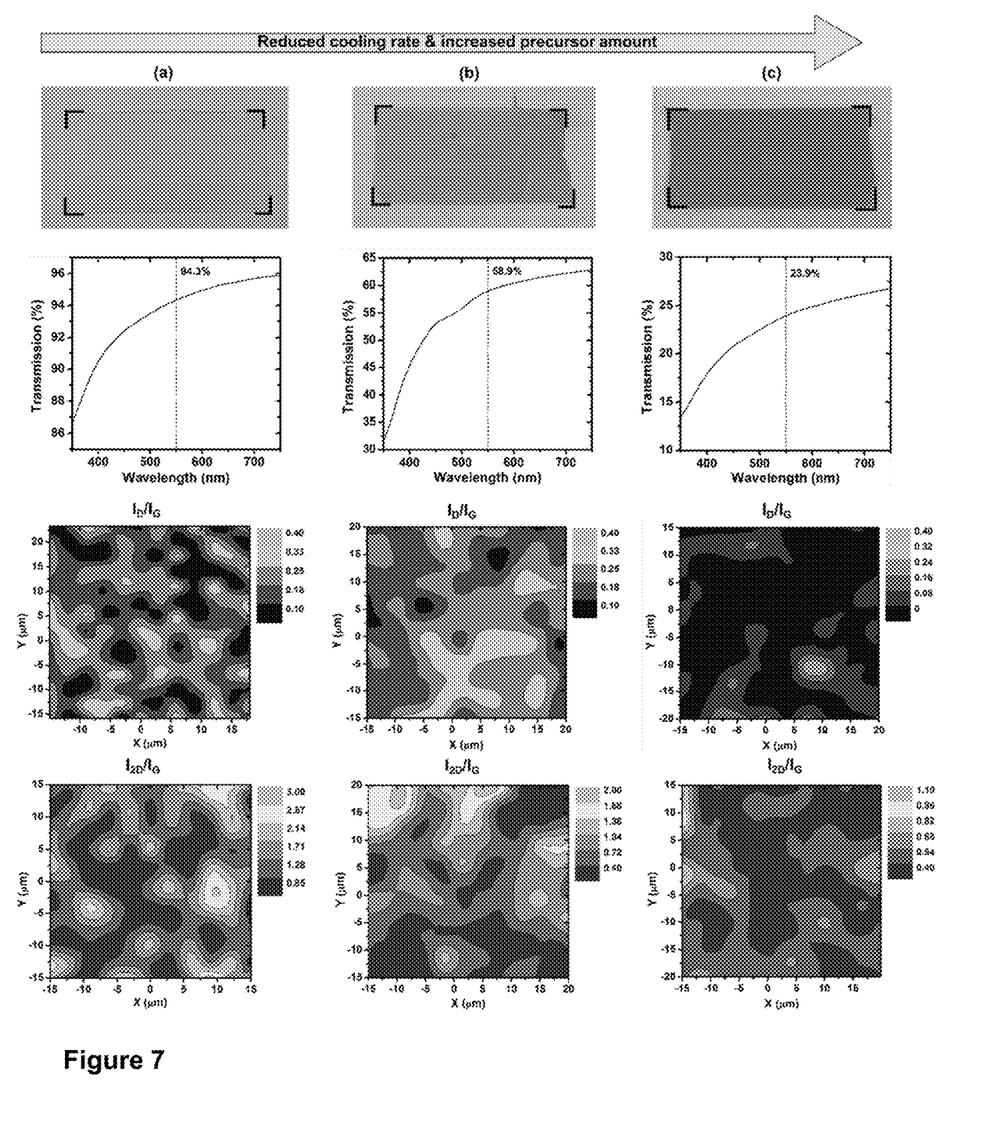
FIG. 7 shows control of the thickness and quality of graphene films with change of growth conditions, as characterized by optical transmission and Raman spectral mapping.

In FIG. 7 (a), when a fast cooling rate and typically ~0.15 mL of precursor per 10 cm² of substrate is used, the graphene films demonstrate an optical transmission of ~94.3%, $I_D/I_G$~0.1-0.33 and $I_{2D}/I_G$~0.85-2.5. These characterizations are consistent with good quality graphene films of 2-3 layers.

In FIG. 7 (b), at a reduced cooling rate and with typically ~0.2 mL of precursor per 10 cm² of substrate being used, optical transmission drops to ~58.9%, $I_D/I_G$~0.1-0.33 and $I_{2D}/I_G$~0.4-1.6. These properties of graphene film are consistent with a film of ~20 layers of graphene.

Finally, in FIG. 7 (c), at the slowest cooling rate and with typically ~0.25 mL of precursor per 10 cm² of substrate being used, optical transmission is ~23.9%, $I_D/I_G$ is ~0-0.3, and $I_{2D}/I_G$ is mostly ~0.4. This indicates a film with ~40 layers with low/no defects.

Without wishing to be bound by theory, a slower cooling rate is believed to provides more time for carbon to segregate to the surface of the Ni foil growth substrate, and an increase in precursor amount directly increases the carbon content within the processing chamber, and therefore, these modifications in growth conditions result in an increased in thickness of the graphene films.

Example 3. Hydrophobicity/Hydrophilcity Control

Figure 8:
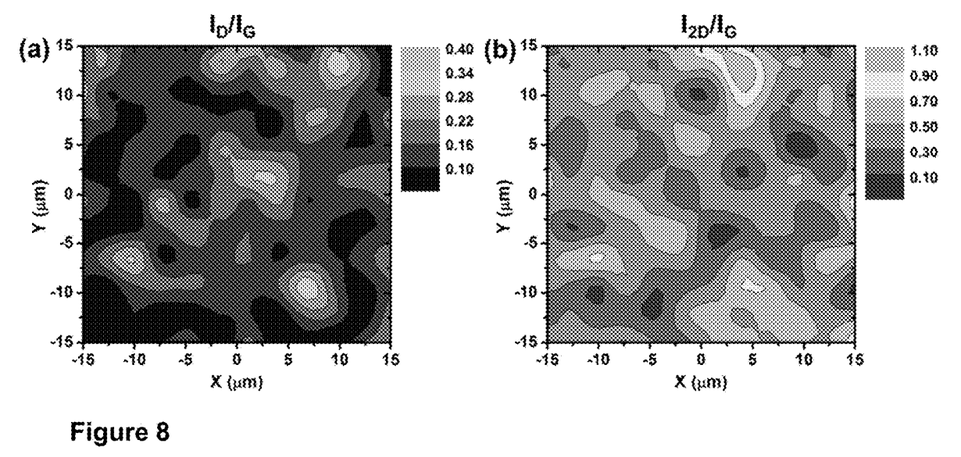
FIG. 8 shows graphene growth at 900° C. as characterized by Raman spectral mapping.

Graphene was grown on a Nickel substrate in accordance with the procedures described above. The growth temperature was raised to 900° C. and maintained for a time period between 3-15 minutes. The results are shown in FIG. 8 (a)-(b), which demonstrate Raman ratios of $I_D/I_G$~0.1-0.3 and $I_{2D}/I_G$~0.1-0.7, which indicate the presence of about 40 layers of graphene films with low/no defects. Again, without wishing to be bound by theory, it is believe that this may be attributed to an overall longer annealing time and faster carbon diffusion rate at a higher temperature, that may allow for more carbon to segregate from the Ni foil growth substrate, leading to overall thicker films.

Contact angle measurements for graphene films grown at 900° C. had a contact angle of 140.2° compared to 96.1° for those grown at 800° C. The films prepared at 900° C. showed a decreased in hydrophobic character compared to those grown at 800° C.

Example 4. Copper Substrate

The growth of graphene was carried out in a thermal CVD furnace (OTF-1200X-UL, MTI Corp). A quartz tube was used. A copper foil (0.025 mm, 99.8%) was used as the growth substrate.

Two alumina crucibles were loaded into a quartz tube. One crucible contained the carbon source, which was 0.1-0.25 mL of soybean oil. The other crucible held a square (10 cm²) of the copper foil growth substrate. These two crucibles were placed close proximity within the quartz tube. The tube was positioned so that both crucibles were within the heating zone of the furnace. The open ends of the quartz tube were then sealed.

The tube was then evacuated to a vacuum of less than 1 mm Hg.

The furnace temperature was raised to 800° C. (30° C./min) followed by an annealing for (3 minutes) 800° C. After the annealing step, the growth substrate was immediately removed from the heating zone to enable a controlled cooling (rate of 50° C./min).

The vacuum in the tube was maintained until the system had returned to room temperature. Throughout the entire growth process, no additional gases were introduced into the quartz tube.

Figure 9:
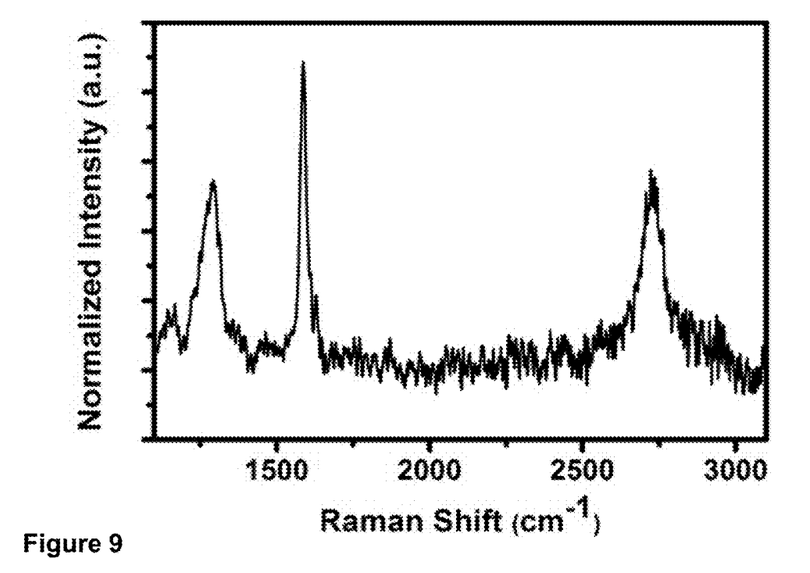
FIG. 9 shows Raman spectral characterization of graphene grown on copper foil.

Once cooled to ambient temperature, the substrate was removed from the tube and the as-grown graphene film was analysed using conventional techniques. FIG. 9 shows Raman spectral characterization of graphene grown on copper foil, made possible by modification of growth conditions in our process. The as-grown graphene indicated the presence of small graphitic islands, spread over the surface of the copper foil growth substrate. These graphitic islands indicated film quality of $I_D/I_G \sim 0.6$ and were of multi-layer thickness ($I_{2D}/I_G \sim 0.5$).

CONCLUSION

The present invention provides a method for synthesis of high-quality, large-area, uniform, and continuous graphene films of a controlled thickness and hydrophobicity, in an atmospheric pressure, compressed gas-free and ambient-air environment. The method is highly scalable, resource-efficient, simple, single-stepped and environmentally-friendly, and offers numerous advantages over conventional thermal CVD techniques for graphene synthesis, which critically rely on numerous resource-consuming procedures and expensive consumables. These methods offer numerous advantages and opportunities for future streamlined integration in large-scale production infrastructures.

The functionality of the as-grown graphene films has been demonstrated by its direct integration into a functioning high performance electrochemical genosensor for Alzheimer's disease.

The invention claimed is:

1. A method of preparing a deposited graphene in the form of a continuous film comprising the steps of:
   sealing a metal substrate and a carbon source in an ambient environment at ambient temperature to create a sealed ambient environment comprising a sealed ambient atmosphere;
   heating the sealed ambient environment to a temperature which produces carbon vapour from the carbon source such that the carbon vapour comes into contact with a surface of the metal substrate;
   maintaining the temperature for a time sufficient to form a graphene lattice and then cooling the metal substrate at a controlled rate to form a deposited graphene continuous film on the surface of the metal substrate that contacts the carbon vapour; and
   wherein the carbon source is a liquid or solid biomass, is derived from a biomass, or is a purified biomass;
   wherein the entire carbon source is not in contact with the metal substrate;
   wherein the method is free from the use of compressed or feedstock gases;
   wherein the sealed ambient atmosphere consists of air at atmospheric pressure or a vacuum;
   wherein the temperature which produces the carbon vapour from the carbon source is in the range of 650° C. to 900° C.; and
   wherein cooling the metal substrate at a controlled rate controls thickness of the deposited graphene continuous film.

2. The method according to claim 1 wherein the metal substrate is a transition metal substrate.

3. The method according to claim 1 wherein the metal substrate is nickel or copper.

4. The method according to claim 3 wherein the metal substrate is nickel and the sealed ambient atmosphere is air at atmospheric pressure.

5. The method according to claim 3 wherein the metal substrate is polycrystalline nickel.

6. The method according to claim 3 wherein the metal substrate is copper and the sealed ambient atmosphere is vacuum.

7. The method according to claim 1 wherein the carbon source is a liquid.

8. The method according to claim 1 wherein the carbon source is soybean oil.

9. The method according to claim 1 wherein a ratio of carbon source to surface area of the metal substrate is 0.01-0.03 mL/cm$^2$.

10. The method according to claim 1 wherein the metal substrate and carbon source are both located in one heating zone.

11. The method according to claim 10 wherein the temperature sufficient to form a graphene lattice is maintained at 800° C.

12. The method according to claim 10 wherein the temperature sufficient to form a graphene lattice is maintained at 900° C.

13. The method according to claim 1 wherein the sealed ambient environment is contained in an inert container.

14. The method according to claim 1 wherein the sealed ambient environment is a quartz, glass or other dielectric heat resistant container.

15. The method according to claim 14 wherein the deposited graphene is in the form of a single layer.

16. The method according to claim 14 wherein the deposited graphene is in the form of 1-19 layers.

17. The method according to claim 1, wherein the temperature sufficient to form the graphene lattice is maintained for 3-15 minutes.

18. The method according to claim 1 wherein the deposited graphene is in the form of 20-40 layers.

19. The method according to claim 1 wherein the deposited graphene is in the form of >40 layers.

20. The method according to claim 1 wherein the substrate is cooled at a controlled rate to segregate the graphene lattice from the metal substrate.

21. The method according to claim 1 wherein the substrate is cooled to ambient temperature at a rate of 10-100° C./minute.

22. The method according to claim 1 further comprising the step of decoupling graphene from the substrate.

* * * * *